(12) United States Patent
Rickes et al.

(10) Patent No.: US 6,704,218 B2
(45) Date of Patent: Mar. 9, 2004

(54) FERAM WITH A SINGLE ACCESS/ MULTIPLE-COMPARISON OPERATION

(75) Inventors: Juergen T. Rickes, Cupertino, CA (US); Hugh P. McAdams, McKinney, TX (US); James W. Grace, Los Altos Hills, CA (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 3 days.

(21) Appl. No.: 10/115,753

(22) Filed: Apr. 2, 2002

(65) Prior Publication Data

US 2003/0185040 A1 Oct. 2, 2003

(51) Int. Cl.[7] .............................................. G11C 11/22
(52) U.S. Cl. .................. 365/145; 365/189.09; 365/210; 365/189.07
(58) Field of Search ........................... 365/145, 189.09, 365/210, 189.07

(56) References Cited

U.S. PATENT DOCUMENTS

| 6,061,266 | A | | 5/2000 | Tan | |
|---|---|---|---|---|---|
| 6,411,540 | B1 | * | 6/2002 | Ashikaga | 365/145 |
| 6,487,130 | B2 | * | 11/2002 | Endo et al. | 365/189.09 |
| 6,501,674 | B2 | * | 12/2002 | Ashikaga | 365/145 |
| 6,563,753 | B1 | * | 5/2003 | Rickes et al. | 365/205 |

\* cited by examiner

*Primary Examiner*—Michael S. Lebentritt
*Assistant Examiner*—Toan Le

(57) ABSTRACT

A comparator-type sense amplifier compares a constant voltage that was read out of a FeRAM cell to a sequence of reference voltage levels. A multiple-comparison operation includes (a) reading out data to a bit line, (b) applying a first/next reference voltage, (c) comparing the bit line voltage to the applied reference voltage, and (d) repeating steps (b) and (c) one or more times. The multiple comparison operation can be used to characterize operation of an FeRAM cell, predict or detect an FeRAM cell that may introduce a bit error, or to read a multi-bit value from an FeRAM cell.

16 Claims, 2 Drawing Sheets

US 6,704,218 B2

FERAM WITH A SINGLE ACCESS/MULTIPLE-COMPARISON OPERATION

BACKGROUND

A conventional FeRAM has memory cells containing ferroelectric capacitors. Each ferroelectric capacitor contains a ferroelectric material sandwiched between conductive plates. To store data in a memory cell, a write operation applies write voltages to the plates of the ferroelectric capacitor to polarize the ferroelectric material in a direction associated with the data bit being written. A persistent polarization remains in the ferroelectric material after the write voltages are removed, which in turn maintains charge on the conductive plates.

A conventional read operation for a FeRAM cell connects one plate of a ferroelectric capacitor to a bit line and raises the other plate to a read voltage. If the persistent polarization in the ferroelectric capacitor is in a direction corresponding to the read voltage, the read voltage causes a relatively small current through the ferroelectric capacitor, resulting in a small voltage change on the bit line. If the persistent polarization initially opposes the read voltage, the read voltage flips the direction of the persistent polarization, discharging the plates and resulting in a relatively large current and voltage increase on the bit line. A sense amplifier can sense the stored value from the resulting bit line current or voltage.

FIG. 1A illustrates a portion of a conventional FeRAM 100 that includes memory cells 110 arranged in rows and columns to form a memory array. Only one column and two rows of memory cells 110 are shown in FIG. 1A for simplicity of illustration, but a typical FeRAM array may include hundreds or thousands of columns of memory cells with a similar number of rows. Each memory cell 110 of FeRAM 100 includes a ferroelectric capacitor 112 and a select transistor 114. Each select transistor 114 has a gate connected to a word line 116 corresponding to the row containing the memory cell and a source/drain connected to a bit line 120 corresponding to the column containing the memory cell.

A conventional read operation accessing a selected memory cell 110 in FeRAM 100 biases a plate of the selected memory cell to a plate voltage Vp (e.g., 3 V), and activates a selected word line 116 to turn on a select transistor 114 thereby electrically connecting the selected ferroelectric capacitor to bit line 120. The difference between the plate voltage and the initial bit line voltage forces the persistent polarization in the selected ferroelectric capacitor into a first state. Bit line 120 acquires a voltage that depends on the initial polarization state of the selected memory cell 110. In particular, if the selected memory cell was in a second state having a persistent polarization in a direction opposite to the persistent polarization of the first state, forcing the memory cell from the second state into the first state causes a relatively large current to bit line 120 and a corresponding rise in the bit line voltage. If the selected memory cell was already in the first state, a relatively small current flows to bit line 120.

A sense amplifier 130 connected to the bit line 120 compares the bit line voltage to a reference voltage Vref. A reference voltage generator (not shown) can generate reference voltage Vref at a level that is above the bit line voltage read out when the selected memory cell 110 has the first polarization state and below the bit line voltage read out when the selected memory cell 110 has the second polarization state. In sense amplifier 130, cross-coupled transistors drive bit line 120 to a logic level (high or low) depending on whether the bit line voltage was greater or less than reference voltage Vref. A bit thus read has a value indicated by the voltage on the bit line after operation of the sense amplifier.

FIG. 1B illustrates an alternative memory 100' in which each memory cell 110' includes two ferroelectric capacitors 112 and 112' connected through respective select transistors 114 and 114' to respective bit lines 120 and 120'. A write operation forces ferroelectric capacitor 112' to a polarization state that is complimentary to the polarization state of ferroelectric capacitor 112. A read operation applies plate voltage Vp to both ferroelectric capacitors 112 and 112' and activates a selected word line 116 to turn on select transistors 114 and 114' and electrically connect selected ferroelectric capacitors 112 and 112' to bit lines 120 and 120', respectively. The read operation thus forces both ferroelectric capacitors 112 and 112' to the first polarization state. The bit line 120 or 120' connected to the ferroelectric capacitor 112 or 112' initially in the second polarization state rises to a higher voltage. Sense amplifier 130 drives the bit lines 120 and 120' connected to the memory cell initial in the second polarization state to complementary voltage, where the voltage on bit line 120 indicates the data bit read from the memory cell.

A read operation for FeRAM cell 110 or 110' of FIG. 1A or 1B generally requires a write-back operation to restore a persistent polarization of a ferroelectric capacitor to the second state if the read operation forced the ferroelectric capacitor from the second state to the first state. In FeRAMs like 100 and 100', sense amplifier 130 drives the bit lines 120 and 120' to voltage suitable for the write-back operations. However, the driven voltage can interfere with uses of FeRAM that may require comparing a read-out bit line voltage to multiple different reference voltages. For example, an on-chip bit failure prediction, detection, and correction method might need to compare the read-out voltage from a memory cell to a series of reference voltages to determine whether the polarization state of the memory cell provides a bit line voltage large enough for an accurate read operation.

Using conventional read operations for comparisons to multiple reference voltages requires repeating the steps of reading a voltage out of a selected memory cell 110 to a bit line and sense amplifier, applying the first or next reference voltage to the sense amplifier, and comparing the read-out voltage to the applied reference voltage. Repetition of these operations is generally too slow for on-chip bit failure correction techniques. Additionally, write-back operations and time dependent failure mechanisms in ferroelectric materials make the charge delivered to a bit line or the voltage read out from a FeRAM cell vary from access to access, particularly because the polarization state of the FeRAM cell is refreshed between comparisons. The comparisons to different reference voltages thus may be inconsistent.

In view of the limitations to current read processes for FeRAM, improved processes and circuits for performing multiple comparisons are desired.

SUMMARY

In accordance with an aspect of the invention, a read out voltage from a ferroelectric capacitor is compared to multiple reference voltages using a sense amplifier that does not disturb the read out voltage on a bit line. Accordingly, a fast series of comparisons can be performed to characterize the performance of an FeRAM cell, to anticipate or detect a bit error, or to read a multi-bit or multi-level value from a single ferroelectric capacitor.

The multiple-comparison operation includes reading out a voltage to a bit line that is otherwise floating and is coupled to a gate of a transistor in a sense amplifier. The read out voltage can be maintained while a series of reference voltages are applied to the sense amplifier for a series of sensing or comparison operations. When the series of operations is complete, a write-back operation restores the polarization state in the selected FeRAM cell.

One specific embodiment of the invention is a device including a bit line connected to FeRAM cells, a reference voltage generator capable of generating a series of voltage levels, and a sense amplifier connected to the bit line and the reference voltage generator. The sense amplifier, which can be a comparator-type sense amplifier, is capable of comparing the voltage on the bit line to each of the series of voltage levels without changing the voltage on the bit line. The device may further include an error detection circuit that predicts, detects, or corrects bit errors based on signals indicating results of comparing the voltage on the bit line to the series of voltage level. Alternatively, the FeRAM cell stores a multi-bit value, and the results of multiple comparisons of the voltage on the bit line to the series of voltage levels indicate the multi-bit value.

Another embodiment of the invention is a process including setting a voltage on a bit line according to a polarization state of an FeRAM cell and comparing the voltage on the bit line to each of multiple reference voltages, while keeping the voltage on the bit line constant throughout multiple comparisons. Applying a first voltage to a first plate of a ferroelectric capacitor in the FeRAM cell and connecting a second plate of the ferroelectric capacitor to the bit line while the bit line is floating can set the voltage on the bit line. The voltage on the bit line generally depends on an amount of current that flows through the ferroelectric capacitor. After completion of comparing the voltage on the bit line to each of the multiple reference voltages, writing back a data value read from the FeRAM cell can restore the polarization state of the FeRAM cell. Results from comparing the voltage on the bit line to each of the multiple reference voltages can characterize the operation of the FeRAM cell, indicate whether the FeRAM cell is operating properly, or indicate a multi-bit value stored in the FeRAM cell.

Yet another embodiment of the invention is a multiple-comparison operation including: (a) reading data out of a FeRAM cell to establish a bit line voltage on a first input node of a sense amplifier; (b) applying a first/next reference voltage to a second input node of the sense amplifier; (c) comparing the bit line voltage to the applied reference voltage, and (d) repeating steps (b) and (c) one or more times while keeping voltage on the first input of the sense amplifier constant.

BRIEF DESCRIPTION OF THE DRAWINGS

Use of the same reference symbols in different figures indicates similar or items.

DETAILED DESCRIPTION

In accordance with an aspect of the invention, an access to an FeRAM cell preserves the voltage read out to a bit line while multiple reference voltages are compared to age read from the FeRAM cell. Accordingly, the multiple comparisons are quick to make an on-chip bit error detection and correction process practical. Further, the comparison operation can characterize the performance of an FeRAM cell when he design of an FeRAM, and FeRAM devices that store multiple bits or levels of ion in a single FeRAM cell can use a multiple-comparison operation to quickly read it value from an FeRAM cell.

Figure 1A:
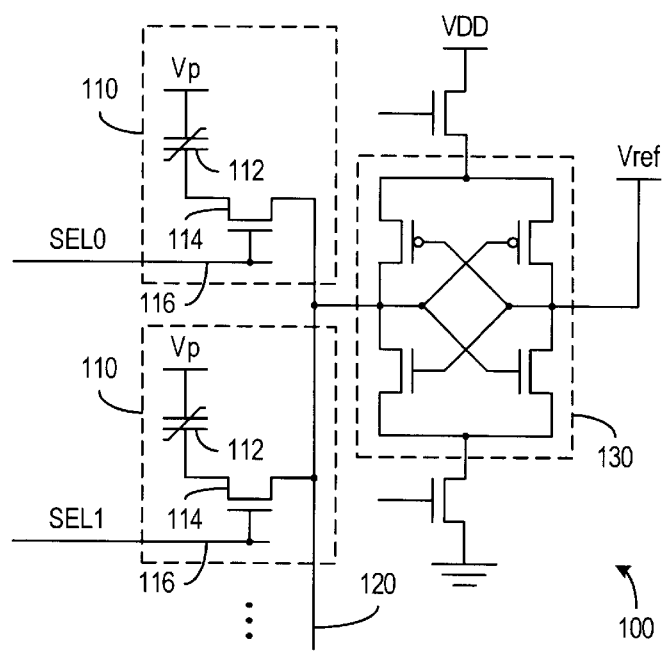
FIGS. 1A and 1B are circuit diagrams of portions of FeRAM devices used in convectional read operations.
Figure 1B:
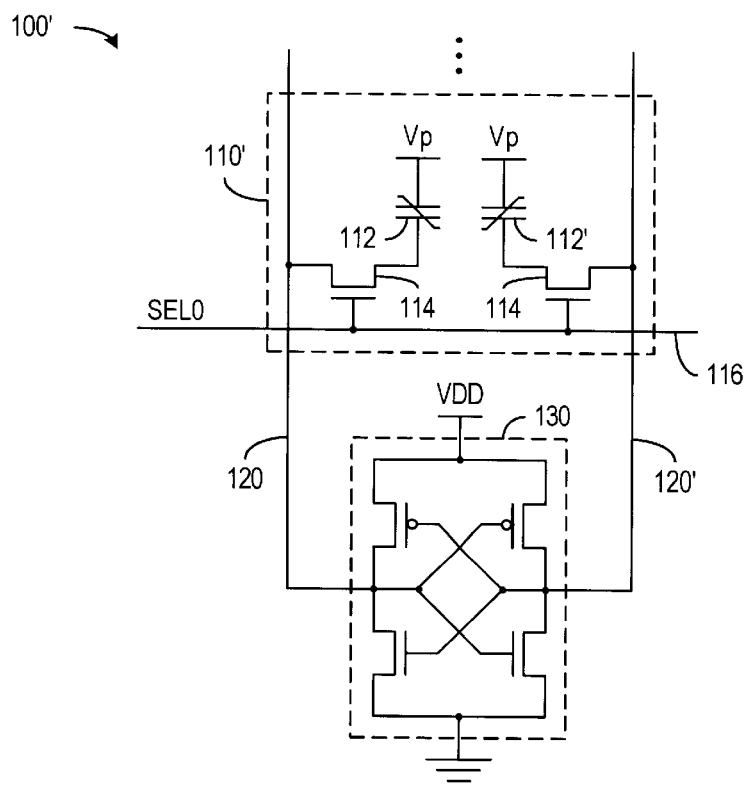
Figure 2:
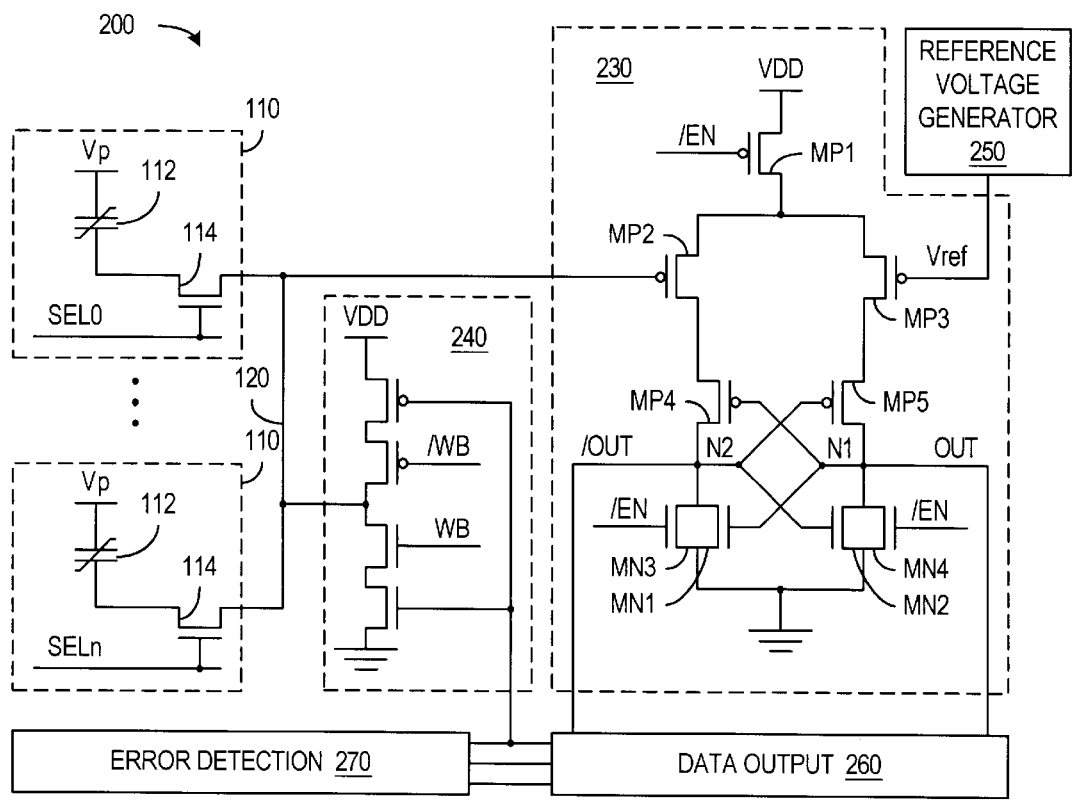
FIG. 2 is a circuit diagram of a portion of an FeRAM suitable for a multiple-comparison operation in accordance with an embodiment of the invention.

FIG. 2 shows a portion of an FeRAM 200 capable of implementing a multiple-comparison operation in accordance with an embodiment of the present invention. FeRAM 200 contains a conventional array of FeRAM cells 110, which are organized into rows and columns. Each FeRAM cell 110 includes a ferroelectric capacitor 112 and a select transistor 114, which can be fabricated using conventional techniques. Bit lines 120 (only one of which is shown in FIG. 2) connect to select transistors of FeRAM cells 110 in respective columns of the memory array. Word lines 116 connect to the gates of select transistors 114 in respective rows of the memory array.

In the illustrated embodiment, sense amplifier 230 is a comparator-type sense amplifier having a separate write-back circuit 240. As illustrated in FIG. 2, sense amplifier 230 includes p-channel transistors MP1, MP2, MP3, MP4, and MP5 and n-channel transistors MN1, MN2, MN3, and MN4. Transistor MP1, which serves to activate and deactivate sense amplifier 230 in response to an enable signal/EN, is between a supply voltage VDD and transistors MP2 and MP3. Transistors MP2, MP4, and MN1 are connected in series between transistor MP1 and ground, and transistors MP3, MP5, and MN2 are similarly connected in series between transistor MP1 and ground. Transistors MN3 and MN4 are connected in parallel with transistors MN1 and MN2, respectively, and respond to enable signal/EN by grounding respective nodes N1 and N2 in preparation for comparison operations.

The gates of transistors MP1 and MP2 are connected to receive input signals respectively from bit line 120 and a reference voltage generator 250 during a multiple-comparison operation. Reference voltage generator 250 can be any circuit capable of generating a reference voltage Vref having a series of different voltage levels, which are to be compared to the bit line voltage. A voltage difference between the bit line voltage and the reference voltage Vref determines whether transistor MP2 or MP3 is more conductive, which in turn influences whether the voltage on node N1 between transistors MP5 and MN2 or the voltage on node N2 between transistors MP4 and MN1 rises more quickly when sense amplifier 240 is activated.

The gates of transistors MP4, MP5, MN1, and MN2 are cross-coupled, so that transistors MP4, MP5, MN1, and MN2 amplify a voltage difference between node N1 and node N2. As a result, an output signal OUT from node N1 is complementary to an output signal/OUT from node N2.

A data output circuit 260 receives complementary output signals OUT and /OUT from sense amplifier 230 and holds comparison results from the comparisons of the bit line voltage read to the series of reference voltage levels. As described further below, the comparison values indicate the data value read from the selected FeRAM cell 110. Typically, data output circuit 260 is a storage circuit such as a latch, flip-flop, or buffer for storage of binary data indicating comparison results.

Write-back circuit 240 is connected to a data output circuit 260. In FIG. 2, write-back circuit 240 is a tri-state inverter that drives bit line 120 in response to a write-back signal WB and a signal from data output circuit 260 indicating the value to be written back. Write-back circuit 240 thus drives bit line 120 to an appropriate voltage for writing a value from data output circuit 260 to the selected FeRAM cell. Plate voltage Vp is typically at an intermediate level (e.g., about 3 volts) for the write-back operation.

Figure 3:
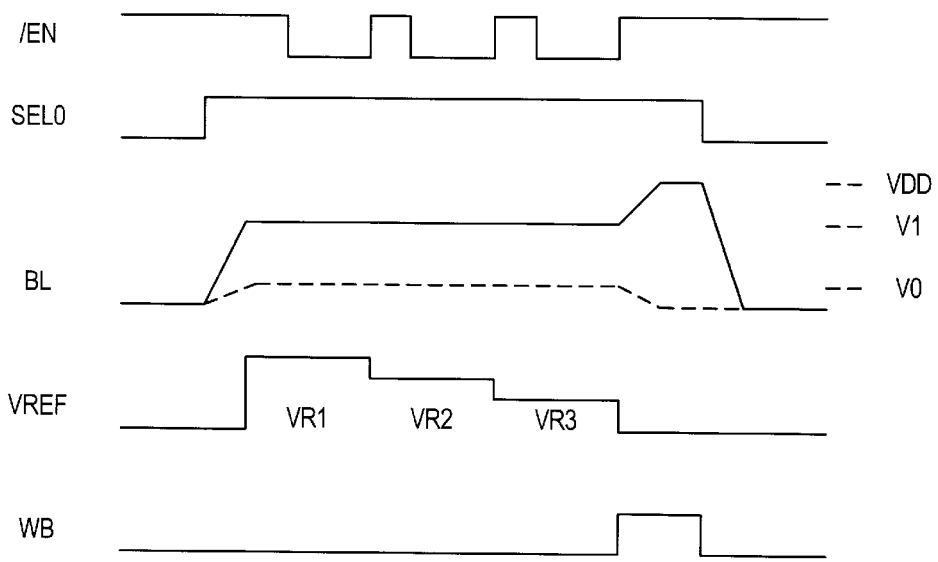
FIG. 3 contains timing diagrams indicating signal levels in the FeRAM of FIG. 2 multiple-comparison operation in accordance with an embodiment of the present invention.

FIG. 3 shows timing diagrams for selected signals in memory 200 of FIG. 2 during a multiple-comparison operation in accordance with an embodiment of the invention. To prepare sense amplifier 230 for the operation, active-low enable signal/EN is initially high causing transistor MP1 to shut off power in sense amplifier 230 and transistors MN3 and MN4 to ground nodes N1 and N2.

To begin the multi-comparison operation, the plate voltage Vp is raised to a read level (e.g., 3 V) and a row decoder (not shown) activates a select signal (e.g., signal SEL0). The activated select signal turns on a select transistor 114 and electrically connects the selected ferroelectric capacitor 112 to bit line 120. The difference between the plate voltage Vp and the initial bit line voltage (e.g., ground) forces the selected ferroelectric capacitor 112 into a polarization state with polarization corresponding to the voltage difference between the plates of the selected ferroelectric capacitor 112. If the selected ferroelectric capacitor was already in the polarization state corresponding to the read voltage difference, bit line 120, which is floating, rises to a voltage V0. If the selected ferroelectric capacitor was initially in the polarization state opposing the read voltage difference, bit line 120 rises to a higher voltage V1. The process of reading out a voltage V0 or V1 from the selected ferroelectric capacitor 112 typically takes about 10 to 30 ns.

Reference voltage Vref is applied to the gate of transistor MP3 at a first level VR1 when the bit line voltage is applied to the gate of transistor MP2. When enable signal/EN is activated (drops low), sense amplifier 230 performs a first comparison of the bit line voltage read out of the selected FeRAM cell to reference voltage Vref. The comparison operation can typically be performed in about 5 to 10 ns. The first comparison result indicates whether the bit line voltage is greater or less than the first level VR1, and complementary output signals OUT and /OUT indicate a first binary value representing the comparison result, which can be temporarily stored in data output circuit 260.

Without changing the bit line voltage, the multi-comparison operation deactivates enable signal/EN and changes the reference voltage Vref to the next level VR2 before reactivating enable signal/EN for a second comparison. The second comparison result indicates whether the bit line voltage is greater or less than the second level VR2, and data output circuit 260 temporarily stores a second binary value indicating the result of the second comparison.

Further comparisons can be conducted in the same fashion. In particular, the multi-comparison operation deactivates enable signal/EN (high) and changes the reference voltage to the next level without changing the bit line voltage and then reactivates enable signal/EN for the next comparison. Each comparison indicates whether the bit line voltage is greater or less than a corresponding level of reference voltage Vref, and data output circuit 260 temporarily stores binary values indicating the result of the comparisons. FIG. 3 illustrates the example of a process performing three comparisons, but more generally, a multiple-comparison operation can perform two or more comparisons.

After the comparisons to all of the desired reference voltage levels VR1, VR2, . . . , the enable signal/EN is deactivated (high), and write-back signal WB is activated (high). A signal from data output circuit 260 controls the voltage that write-back circuit 240 drives on bit line 120 so that the original data value is rewritten to the selected FeRAM cell 110. The multi-comparison operation thus performs a single write-back operation for multiple comparison operations, which is much faster than performing write-back operations after each comparison.

The comparison values from data output circuit 260 can also be used for a variety of purposes in different applications. An on-chip bit error detection circuit 270 can use the comparison values to determine whether accessing the selected FeRAM cell provides a bit line voltage that is high enough for a reliable read operation. Reference voltage level VR1 can be, for example, the desired bit line voltage V1 for a FeRAM having its polarization state changed during a read operation, while the other reference voltage levels VR2 and VR3 are lower than voltage V1 but higher than the voltage V0 that results when the access does not change the polarization state of the selected FeRAM cell. A multiple-comparison operation that finds a bit line voltage lower than level VR1 but higher than level VR2 or VR3 indicates that the selected FeRAM cell was storing a data value corresponding to the polarization state flipped but did not provide the expected bit line voltage. An error signal could then be generated, or the FeRAM cell could be replaced with a redundant FeRAM cell to prevent data errors. FIG. 2 shows an error detection block 270 representing a peripheral circuit that detects errors from the comparison results from data output circuit 260.

Another use of the multiple-comparison operation is for storage of more than a binary value in an FeRAM cell. If memory 200 had polarization states of different polarization magnitudes and corresponding to different data values, the levels VR1, VR2, . . . of reference voltage Vref can be the boundaries of ranges for bit line voltages corresponding to the different polarization states. The comparison results from data output circuit 260 indicate a voltage range for the bit line voltage read out of the selected FeRAM cell and therefore indicate the data value stored in the selected FeRAM cell.

The multiple-comparison operations as described above allow on-chip bit failure prediction, detection, and correction and provide a very fast (up to 40 times faster than convention techniques) and efficient way to capture charge distributions. Additionally, the multiple-comparison operation reduces or eliminates fatigue and imprint problems that may arise from repeated read and write-back operations.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. A device comprising:

FeRAM cells;

a bit line connected to the FeRAM cells;

a reference voltage generator capable of sequentially generating a series of voltage levels; and a sense amplifier connected to the bit line and the reference voltage generator, wherein the sense amplifier operates to sequentially compare each of the series of voltage levels to a voltage on the bit line without changing the voltage on the bit line.

2. The device of claim 1, wherein a selected one of the FeRAM cells stores a multi-bit value, and results of multiple comparisons of the voltage on the bit line to the series of voltage levels indicate the multi-bit value when a read operation sets the voltage on the bit line according to a state in the selected FeRAM cell.

3. The device of claim 1, wherein the sense amplifier comprises a comparator.

4. The device of claim 1, wherein the sense amplifier comprises:
   a first transistor, a second transistor, and a third transistor that are connected in series between a supply voltage and ground; and
   a fourth transistor, a fifth transistor, and a sixth transistor that are connected in series between the supply voltage and ground, wherein:
      the first transistor has a gate coupled to the bit line;
      the second transistor is a P-channel transistor having a gate coupled to a first output node that is between the fifth transistor and the sixth transistor;
      the third transistor is an N-channel transistor having a gate coupled to the first output node;
      the fourth transistor has a gate coupled to the reference voltage generator;
      the fifth transistor is a P-channel transistor having a gate coupled to a second output node that is between the second transistor and the third transistor; and
      the sixth transistor is an N-channel transistor having a gate coupled to the second output node.

5. The device of claim 4, wherein each of the first transistor and the fourth transistor is a P-channel transistor.

6. A device comprising:
   FeRAM cells;
   a bit line connected to the FeRAM cells;
   a reference voltage generator capable of generating a series of voltage levels;
   a sense amplifier connected to the bit line and the reference voltage generator, wherein the sense amplifier is capable of comparing voltage on the bit line to each of the series of voltage levels without changing the voltage on the bit line; and
   an error detection circuit connected to the sense amplifier to receive signals indicating results of comparing the voltage on the bit line to the series of voltage levels.

7. The device of claim 6, wherein the error detection circuit uses the signals indicating the results of comparing the voltage on the bit line to the series of voltage levels to determine whether accessing the voltage on the bit line is sufficient for a reliable read operation.

8. A process comprising:
   setting a voltage on a bit line according to a polarization state of an FeRAM cell; and
   sequentially comparing each of a series of reference voltages to the voltage on the bit line, wherein the voltage on the bit line is maintained throughout multiple comparisons.

9. The process of claim 8, wherein setting the voltage on the bit line comprises:
   applying a first voltage to a first plate of a ferroelectric capacitor in the FeRAM cell; and
   connecting a second plate of the ferroelectric capacitor to the bit line while the bit line is floating, wherein the voltage on the bit line depends on an amount of current that flows through the ferroelectric capacitor.

10. The process of claim 8, further comprising using results from comparing the voltage on the bit line to each of the series of reference voltages to determine whether the FeRAM cell is operating properly.

11. The process of claim 8, further comprising using results from comparing the voltage on the bit line to each of the series of reference voltages to determine a multi-bit value stored in the FeRAM cell.

12. The process of claim 8, further comprising using results from comparing the voltage on the bit line to each of the series of reference voltages to characterize operation of the FeRAM cell.

13. A process comprising
   setting a voltage on a bit line according to a polarization state of an FeRAM cell;
   comparing the voltage on the bit line to each of multiple reference voltages, wherein the voltage on the bit line is maintained throughout multiple comparisons; and
   writing back a data value read from the FeRAM cell to restore the polarization state of the FeRAM cell, wherein writing back is performed only after completion of comparing the voltage on the bit line to each of the multiple reference voltages.

14. The process of claim 7, wherein setting the voltage on the bit line comprises:
   applying a first voltage to a first plate of a ferroelectric capacitor in the FeRAM cell; and
   connecting a second plate of the ferroelectric capacitor to the bit line while the bit line is floating, wherein the voltage on the bit line depends on an amount of current that flows through the ferroelectric capacitor.

15. A multiple-comparison operation comprising:
   (a) reading data out of a FeRAM cell to establish a bit line voltage on a first input node of a sense amplifier;
   (b) applying a first/next reference voltage to a second input node of the sense amplifier;
   (c) comparing the bit line voltage to the applied reference voltage, and
   (d) repeating steps (b) and (c) one or more times while keeping voltage on the first input node of the sense amplifier constant.

16. The multiple comparison operation of claim 15, further comprising writing back a data value to the FeRAM cell only after completing the one or more repetitions of steps (b) and (c).

* * * * *